(12) United States Patent
Wu et al.

(10) Patent No.: US 12,740,021 B2
(45) **Date of Patent: *Sep. 15, 2026**

(54) JOINT MODULE AND SERVER SYSTEM

(71) Applicant: Fulian Precision Electronics (Tianjin) Co., LTD., Tianjin (CN)

(72) Inventors: Chang-Ju Wu, New Taipei (TW); Chih-Min Lin, New Taipei (TW)

(73) Assignee: Fulian Precision Electronics (Tianjin) Co., LTD., Tianjin (CN)

(*) Notice: Subject to any disclaimer, the term of this patent is extended or adjusted under 35 U.S.C. 154(b) by 361 days.

This patent is subject to a terminal disclaimer.

(21) Appl. No.: 18/588,199

(22) Filed: Feb. 27, 2024

(65) Prior Publication Data

US 2024/0414891 A1 Dec. 12, 2024

(30) Foreign Application Priority Data

Jun. 6, 2023 (CN) ......................... 202310667429.5

(51) Int. Cl.
*H05K 7/20* (2006.01)
*F16L 27/053* (2006.01)
*H05K 7/14* (2006.01)

(52) U.S. Cl.
CPC ........ *H05K 7/20772* (2013.01); *F16L 27/053* (2013.01); *H05K 7/1489* (2013.01)

(58) Field of Classification Search
CPC ......................... H05K 7/1489; H05K 7/20772
USPC ......................................................... 439/248
See application file for complete search history.

(56) References Cited

U.S. PATENT DOCUMENTS 6,558,177 B2 * 5/2003 Havener ................ H01R 24/50 439/246
6,655,974 B2 * 12/2003 Nakano ................ H05K 7/1007 439/259
6,699,054 B1 * 3/2004 Critelli ................... H01R 24/50 439/63
6,867,381 B1 * 3/2005 Pan ...................... H01H 35/025 200/61.52
6,945,666 B2 * 9/2005 Woolfson .................. G01P 3/40 362/208
7,258,559 B2 * 8/2007 Mattern ............. H01R 13/6315 439/35
7,390,207 B2 * 6/2008 Noguchi ............ H01R 13/6315 439/248

(Continued)

FOREIGN PATENT DOCUMENTS

TW I796736 3/2023

*Primary Examiner* — Harshad C Patel
(74) *Attorney, Agent, or Firm* — ScienBiziP, P.C.

(57) ABSTRACT

A joint module for offsetting manufacturing tolerance comprises an outer joint, a middle joint, an inner joint, a plug connector, and a reset component. The middle joint is movable in radial directions of an axis of the outer joint. The inner joint is rotatable around radial directions of an axis of the middle joint, and the axis of the middle joint is parallel to the axis of the outer joint. The plug connector is fixed to the inner joint. The reset component is placed between the outer joint, the middle joint, and the inner joint, to reset the middle joint and the inner joint until the axis of the plug connector, the outer joint, and the middle joint are coincided. A server system with the joint module is also disclosed.

20 Claims, 11 Drawing Sheets

(56) References Cited

U.S. PATENT DOCUMENTS

| | | | | |
|---|---|---|---|---|
| 7,708,578 | B1 * | 5/2010 | Lenox | H01R 13/5219 439/248 |
| 7,713,076 | B2 * | 5/2010 | Arts | H01R 13/748 439/63 |
| 8,376,766 | B1 * | 2/2013 | Huettner | H01R 13/533 439/248 |
| 9,252,532 | B2 * | 2/2016 | Riedel | H01R 25/14 |
| 12,431,666 | B2 * | 9/2025 | Nielsen | H01R 13/631 |
| 2007/0111566 | A1 * | 5/2007 | Seibert | H01R 12/7076 439/91 |
| 2016/0104969 | A1 * | 4/2016 | An | H01R 13/6315 439/248 |
| 2024/0414872 | A1 * | 12/2024 | Wu | H05K 7/20772 |

* cited by examiner

JOINT MODULE AND SERVER SYSTEM

FIELD

The disclosure herein generally relates to information computing systems, and more particularly relates to a joint module and a server system.

BACKGROUND

When a server is installed in a rack, a plug connector behind the server needs to be connected to a plug on the rack, so that the rack can provide coolant to the server to cool the server. However, due to tolerances in the manufacturing process, the plug connector of the server and the plug of the rack are sometimes misaligned, resulting in the plug connector of the server and the plug of the rack unable to connect.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
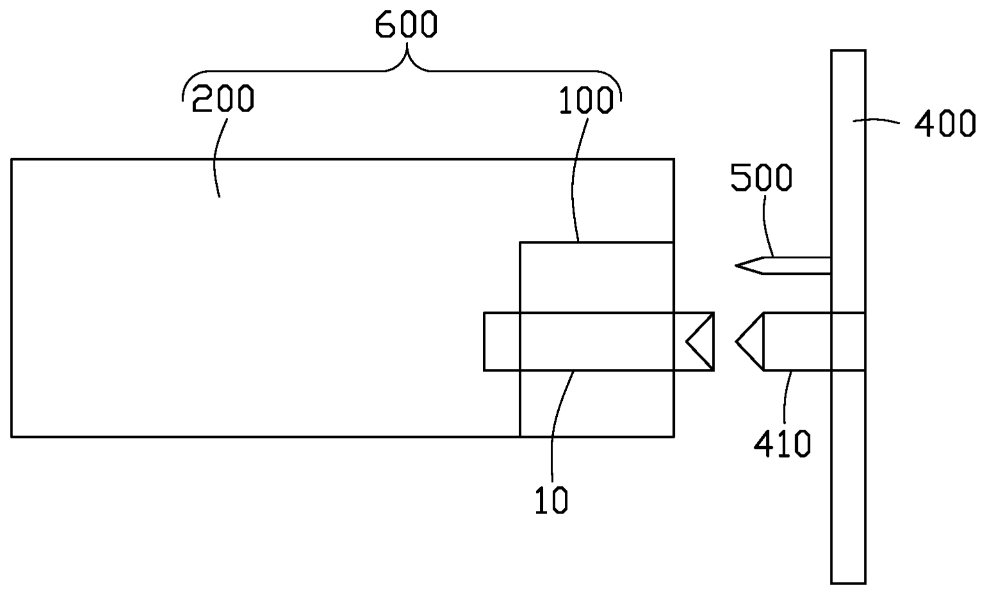
FIG. 1 is a diagram view of an embodiment of a server system according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1 to FIG. 4, a server system 300 in an embodiment includes a rack 400 and a plurality of servers 600. The plurality of servers 600 can be installed into the rack 400 in layers. The rack 400 includes a plurality of plugs 410, and there is at least one plug 410 in each layer. Each server 600 has a plug connector 10 in the back. When one of the plurality of servers 600 is installed into the rack 400, the plug connector 10 needs to be connected to the plug 410 in the same layer, so that the rack 400 can provide coolant to the server 600 to cool the server 600. Usually, there are two plugs 410 in each layer in the rack 400, and there are two plug connectors 10 in the back of each server 600, when the server 600 is installed into the rack 400, the two plug connectors 10 are connected to the two plugs 410 one-to-one, so that the coolant can be circulated between the server 600 and the rack 400.

The rack 400 further includes a guiding pin 500 in each layer. Each server 600 has a guiding hole (not shown in FIGS.) in the back. When a server 600 is installed into the rack 400, the guiding pin 500 is inserted into the guiding hole to guide the movement of the server 600. Normally, when guiding pin 500 is aligned with the guiding hole, the plug connector 10 should be aligned with the plug 410, to ensure that the server 600 is installed properly.

Figure 2:
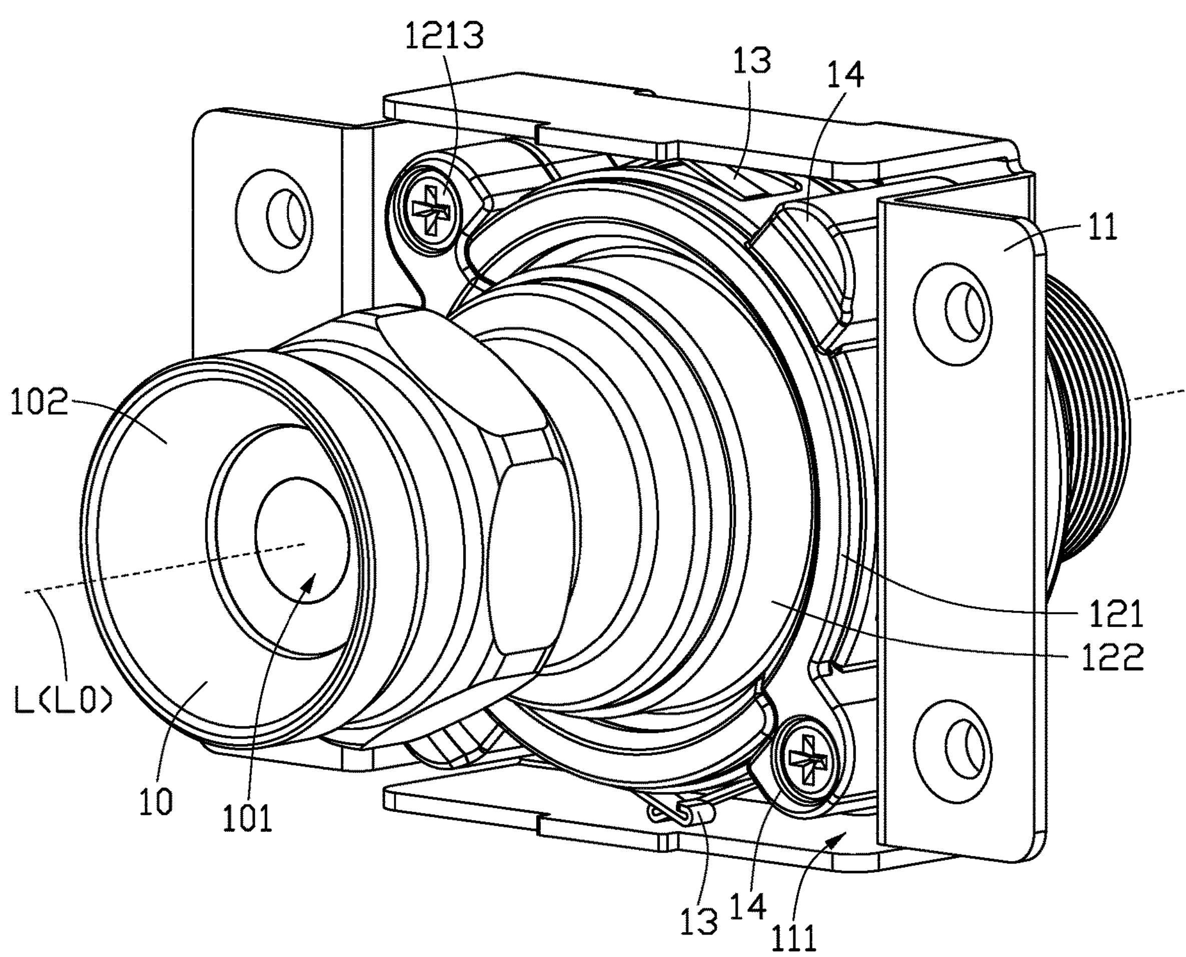
FIG. 2 is an isometric view of an embodiment of a joint module according to the present disclosure.
Figure 3:
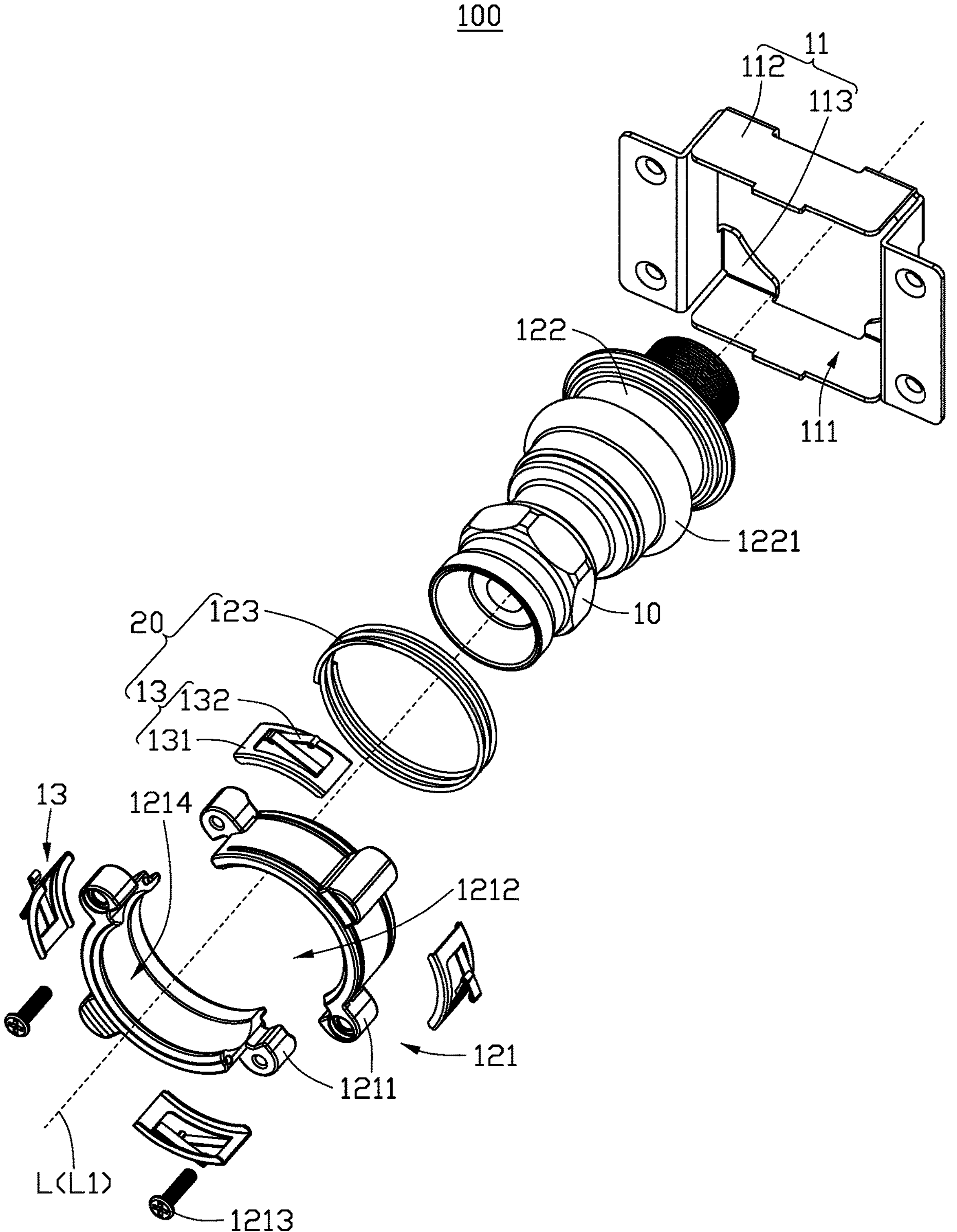
FIG. 3 is an explored view of the joint module shown in FIG. 2.

However, sometimes when guiding pin 500 is aligned with the guiding hole, the plug connector 10 is not aligned with the plug 410 due to manufacturing tolerances for example, resulting in the plug connector 10 being unable to connect the plug 410. As shown in FIG. 1 to FIG. 3, in some embodiments, to solve the problem mentioned above, the server system 300 includes a chassis 200 and a joint module 100, and the joint module 100 is located on the chassis 200.

The joint module 100 includes an outer joint 11, a middle joint 121, an inner joint 122, the plug connector 10, and a reset component 20. The outer joint 11 is fixed to the chassis 200. The middle joint 121 is connected to the outer joint 11, and the middle joint 121 is movable in any radial direction of an axis L0 of the outer joint 11. The inner joint 122 is connected to the middle joint 121, and the inner joint 122 is rotatable around any radial direction of an axis L1 of the middle joint 121. The axis L1 of the middle joint 121 is always parallel to the axis L0 of the outer joint 11. The plug connector 10 is fixed to the inner joint 122, an axis L2 of the inner joint 122 is coincided with an axis L of the plug connector 10. The reset component 20 is placed between the outer joint 11, the middle joint 121, and the inner joint 122.

Figure 4:
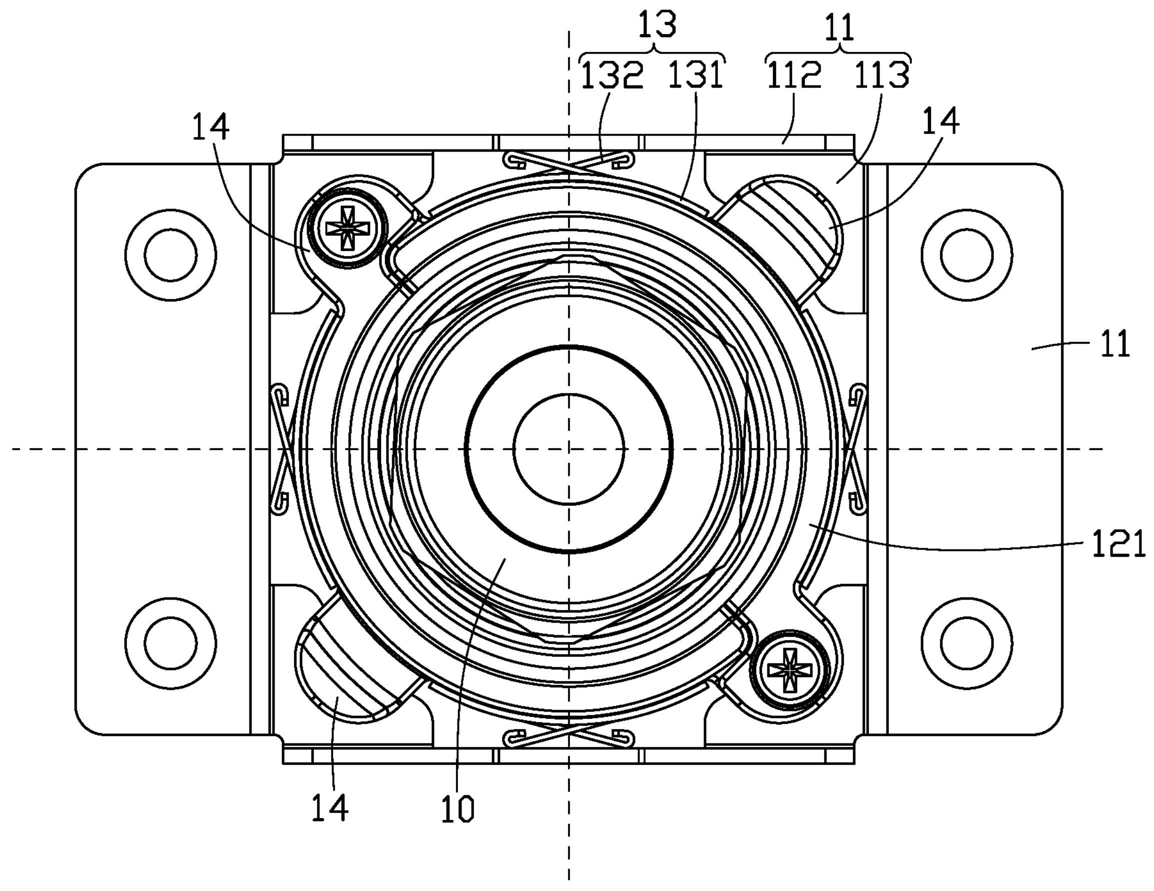
FIG. 4 is a front view of the joint module shown in FIG. 2, showing a middle joint and an inner joint are reset.

The reset component 20 is used to reset the middle joint 121 and the inner joint 122, so that the axis L of the plug connector 10, the axis L0 of the outer joint 11, and the axis L1 of the middle joint 121 are coincided, as shown in FIGS. 2 to 4, for preparing for the next attachment of the plug 410 and the plug connector 10.

When a server 600 is installed into the rack 400, the server 600 moves along a direction parallel to the axis L0 of the outer joint 11, if the plug 410 is aligned with the plug connector 10, the plug connector 10 will connect the plug 410 smoothly; if the plug 410 is not aligned with the plug connector 10, because the plug connector 10 is rotatable and movable, the plug 410 will force the plug connector 10 to rotate and move when the plug 410 contact the plug connector 10, to force the plug connector 10 to be aligned with the plug 410, so that the plug connector 10 is able to connect the plug 410 properly, realizing a function of auto-calibration.

In some embodiments, as shown in FIGS. 2 and 3, the outer joint 11 has a first cavity 111, and the middle joint 121 is placed in the first cavity 111. The reset component 20 includes a plurality of first elastic pieces 13. The plurality of first elastic pieces 13 are arranged around the axis L1 of the middle joint 121, and the plurality of first elastic pieces 13 are placed between the outer joint 11 and the middle joint 121. The plurality of first elastic pieces 13 are used to push the middle joint 121 in the radial directions of the axis L0 of the outer joint 11 to reset the middle joint 121.

Figure 5:
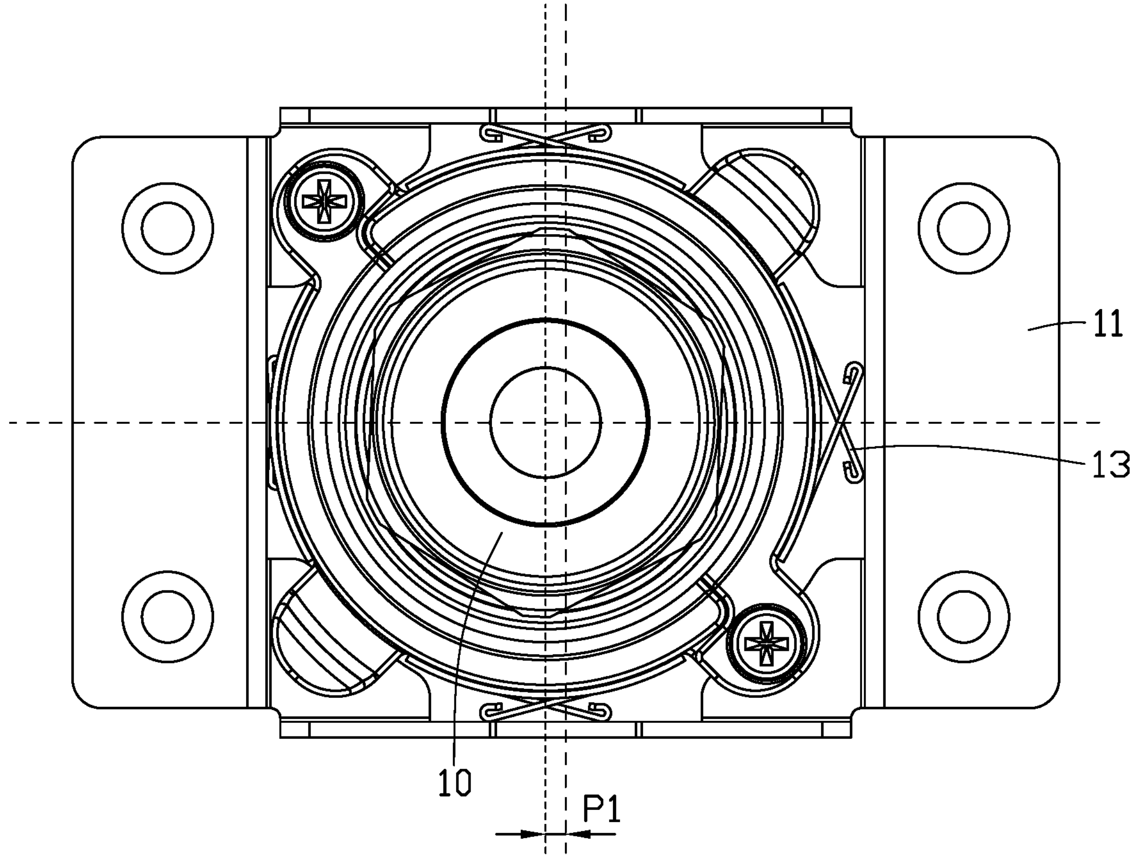
FIG. 5 is a front view of the joint module shown in FIG. 2, showing a plug connector is moved to a left side of an outer joint.
Figure 6:
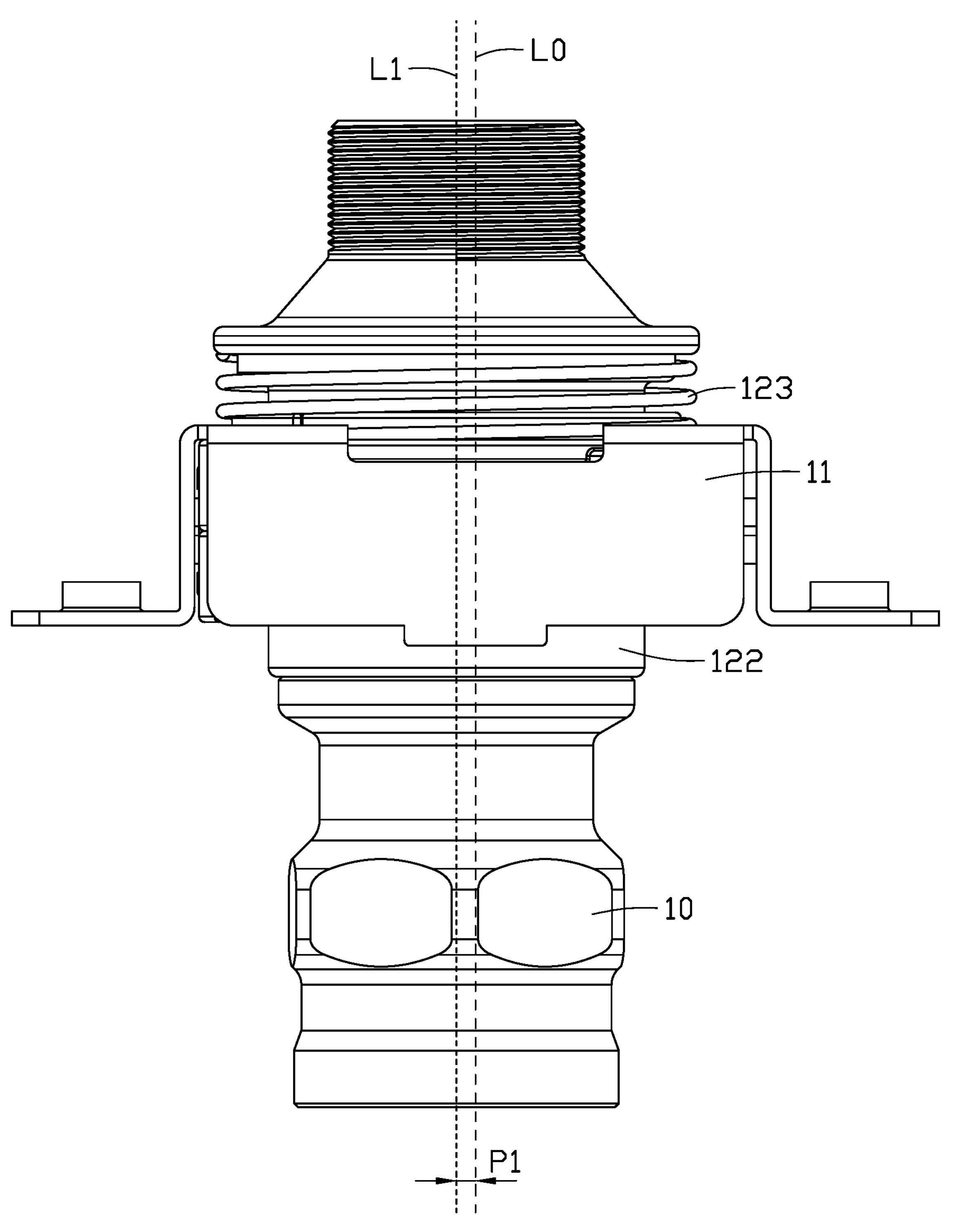
FIG. 6 is a top view of the joint module shown in FIG. 5.

In some embodiments, there are four first elastic pieces 13 are placed 90 degrees apart centered around the middle joint 121, so the four first elastic pieces 13 are placed on the left, right, top, and bottom of the middle joint 121. For example, when the plug 410 contacts the plug connector 10 and forces the middle joint 121 only to move left, as shown in FIGS. 5 and 6, the first elastic pieces 13 on the left is compressed. When the server 600 is removed from the rack 400, the plug 410 is removed from the plug connector 10, so the first elastic pieces 13 on the left will push the middle joint 121 to move right until the axis L1 of the middle joint 121 is coincided with the axis L0 of the outer joint 11, thus resetting the middle joint 121.

Figure 7:
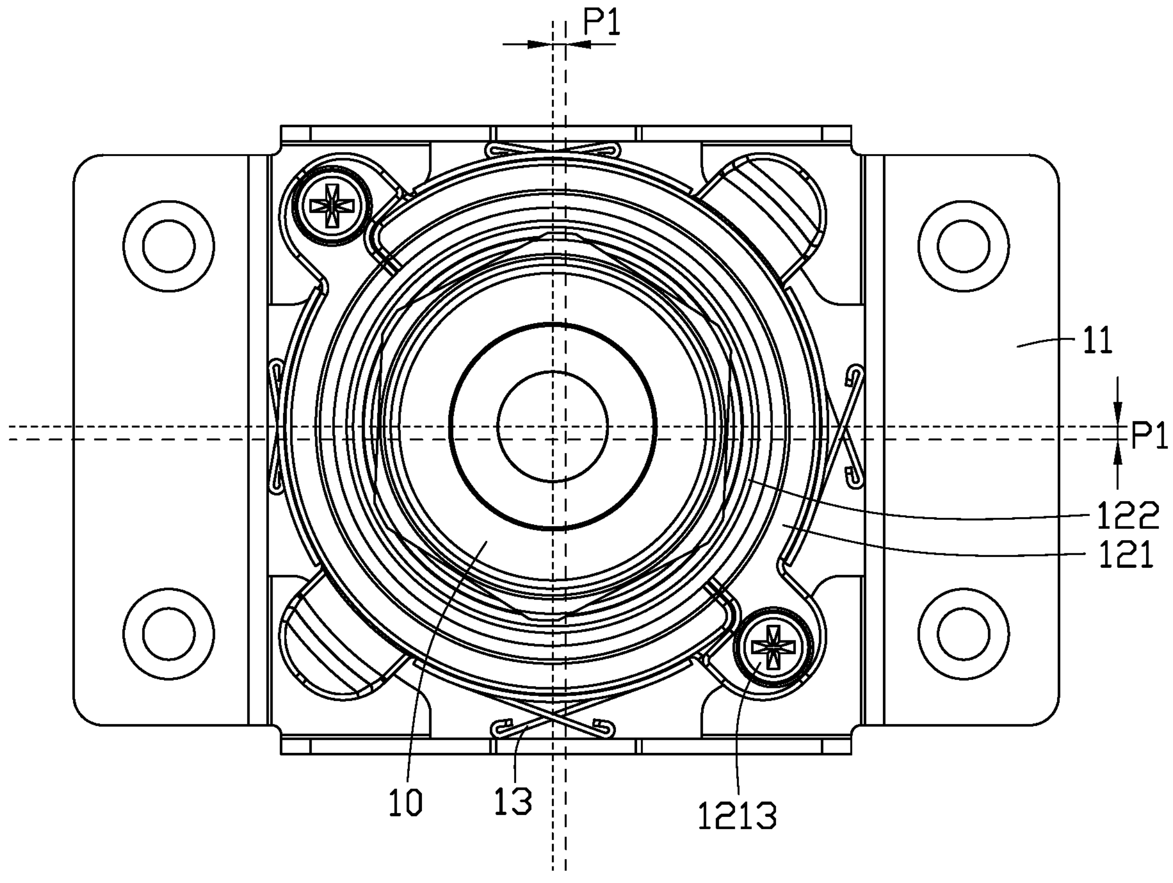
FIG. 7 is a front view of the joint module shown in FIG. 2, showing the plug connector is moved up and to a left side of an outer joint.
Figure 8:
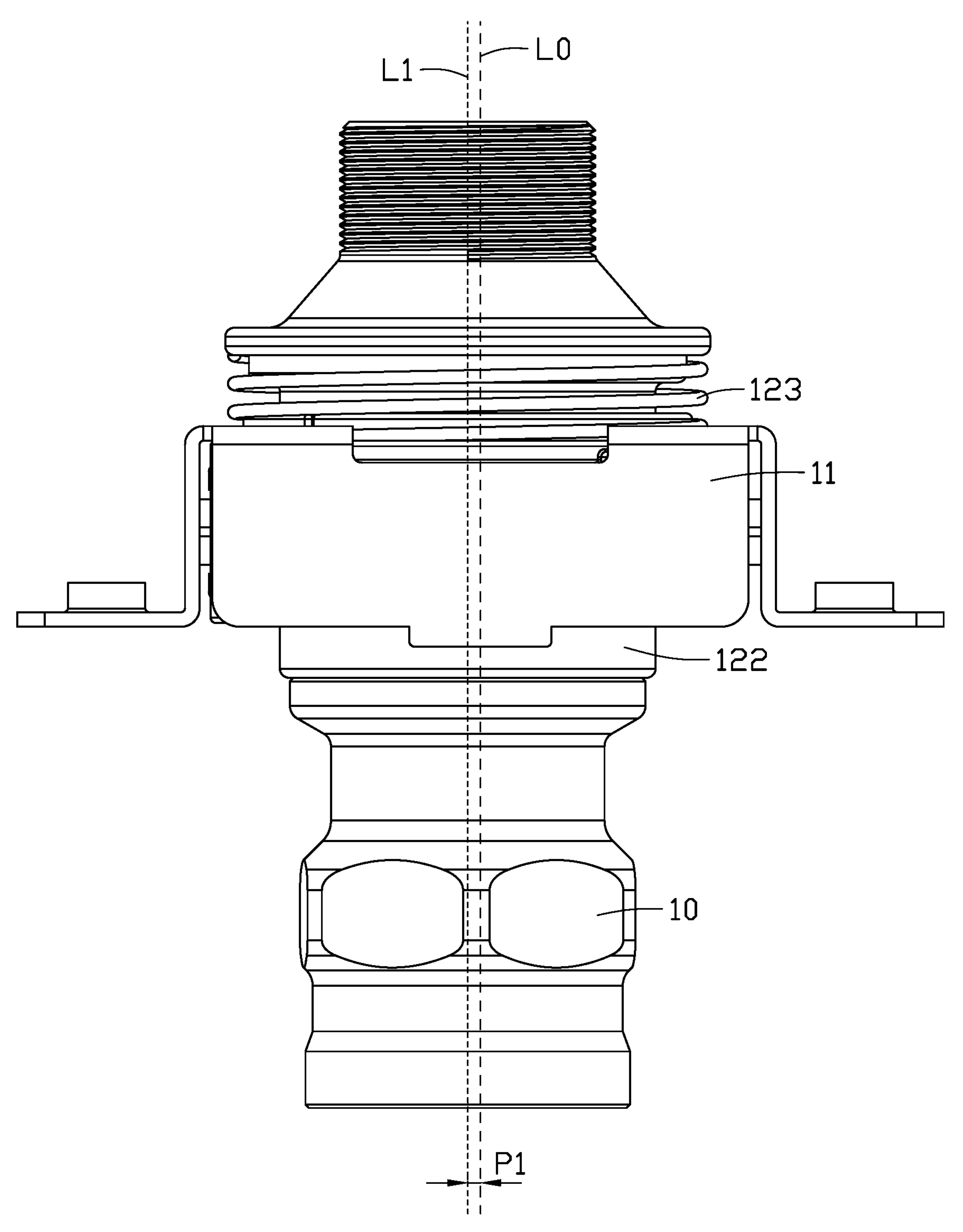
FIG. 8 is a top view of the joint module shown in FIG. 7.

For another example, when the plug 410 contacts the plug connector 10 and forces the middle joint 121 only to move up left, as shown in FIGS. 7 and 8, the first elastic pieces 13 on the left and the first elastic pieces 13 on the top are compressed. When the server 600 is removed from the rack 400, the plug 410 is removed from the plug connector 10, so the first elastic pieces 13 on the left and the first elastic pieces 13 on the top will push the middle joint 121 to move right and down until the axis L1 of the middle joint 121 is coincided with the axis L0 of the outer joint 11, thus resetting the middle joint 121.

As shown in FIGS. 5 and 7, the distance P1 that the middle joint 121 moves left, right, up, or down is in a range of 0-2.2 mm, such as the distance P1 is equal to 0.5 mm, 0.8 mm, 1.1 mm, 1.6 mm, 2.0 mm, or 2.2 mm.

Figure 11:
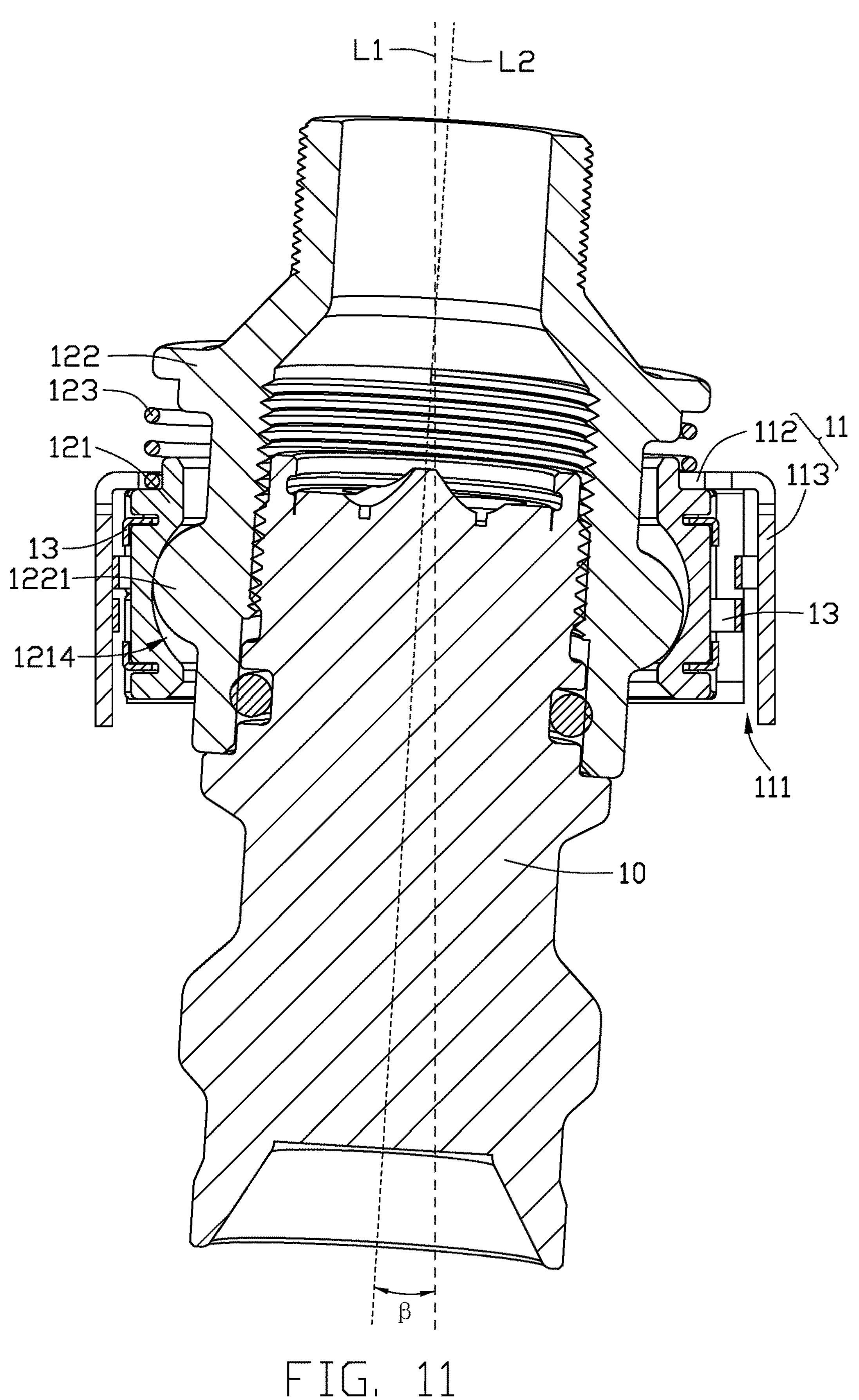
FIG. 11 is a section view of the joint module shown in FIG. 9.

In some embodiments, as shown in FIGS. 3 and 11, the middle joint 121 has a second cavity 1212 along the axis L1, and the inner joint 122 passes through the second cavity 1212. The middle joint 121 has an annular arc groove 1214 in the second cavity 1212. The annular arc groove 1214 is centered around the axis L1 of the middle joint 121. The inner joint 122 has a bulge ring 1221 centered around the axis L2 of the inner joint 122, and the bulge ring 1221 is placed in the annular arc groove 1214. The section shape of the annular arc groove 1214 and the bulge ring 1221 are arc-shaped, and the width of the annular arc groove 1214 is larger than the width of the bulge ring 1221, so the bulge ring is rotatable in the annular arc groove 1214 around the radial directions of the axis L1 of the middle joint 121.

In some embodiments, as shown in FIG. 3, the middle joint 121 includes two half rings 1211, and the middle joint 121 is formed by a combination of the two half rings 1211. The second cavity 1212 is formed in the hollow center of the combination of the two half rings 1211. The annular arc groove 1214 is formed in an inner surface of the combination of the two half rings 1211. The two half rings 1211 can make it easier to assemble the middle joint 121 and the inner joint 122.

In some embodiments, as shown in FIG. 3, each of the plurality of first elastic pieces 13 includes a frame 131 and at least one leaf spring 132. The frame 131 is fixed on an outer surface of the combination of the two half rings 1211. Each of the at least one leaf spring 132 has two ends, one of the two ends is connected to the frame 131, another one of the two ends pushes the outer joint 11 in the first cavity 111. The at least one leaf spring 132 is used to reset the middle joint 121.

Furthermore, in each of the plurality of first elastic pieces 13, there are two leaf springs 132, and the two leaf springs 132 are arranged crosswise on the frame 131, the two leaf springs 132 in a form of a cross can better reset the middle joint 121.

In some embodiments, as shown in FIGS. 3 and 11, the reset component 20 further includes a second elastic piece 123. The second elastic piece 123 is placed between the middle joint 121 and the inner joint 122, the second elastic piece 123 is used to push the inner joint 122 along the axis L1 of the middle joint 121 to reset the inner joint 122. For example, the second elastic piece 123 is a compression spring.

Figure 9:
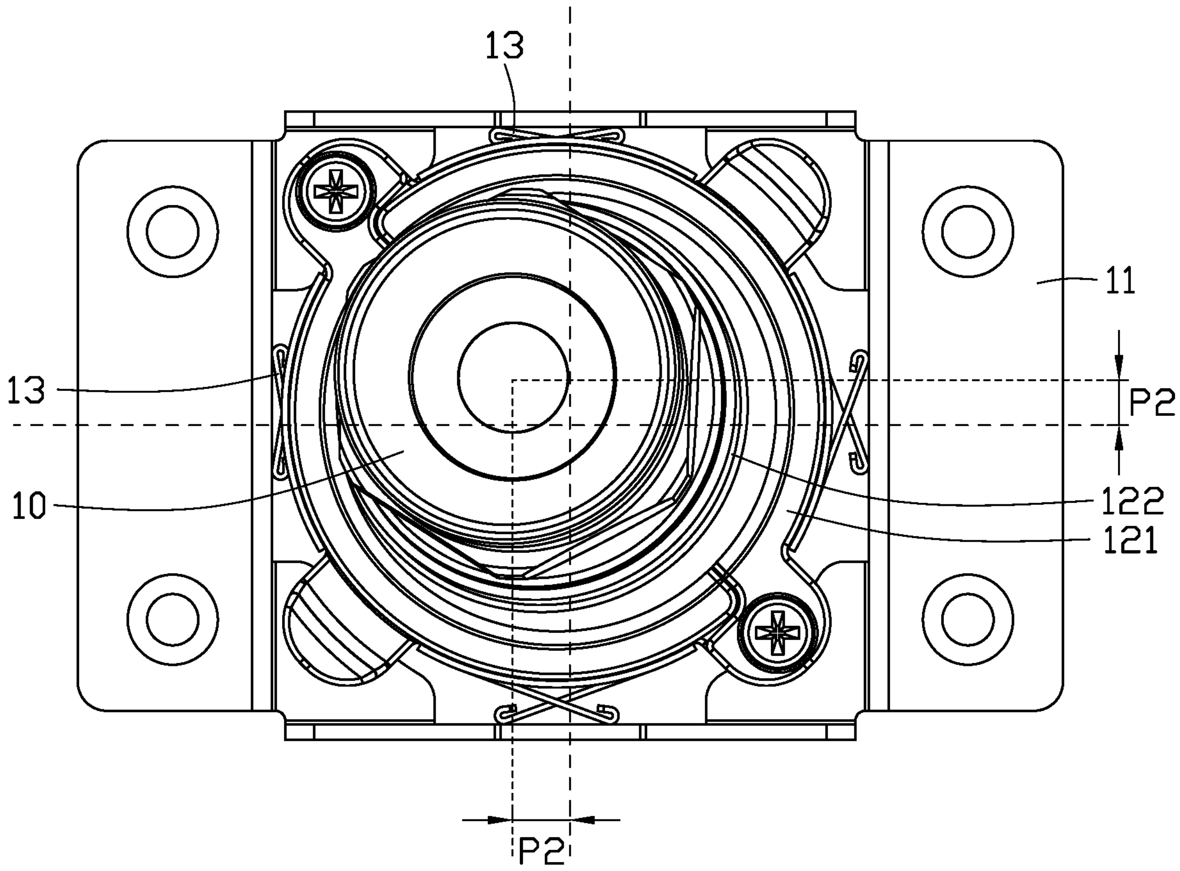
FIG. 9 is a front view of the joint module shown in FIG. 2, showing the plug connector is rotated up and to a left side of an outer joint.
Figure 10:
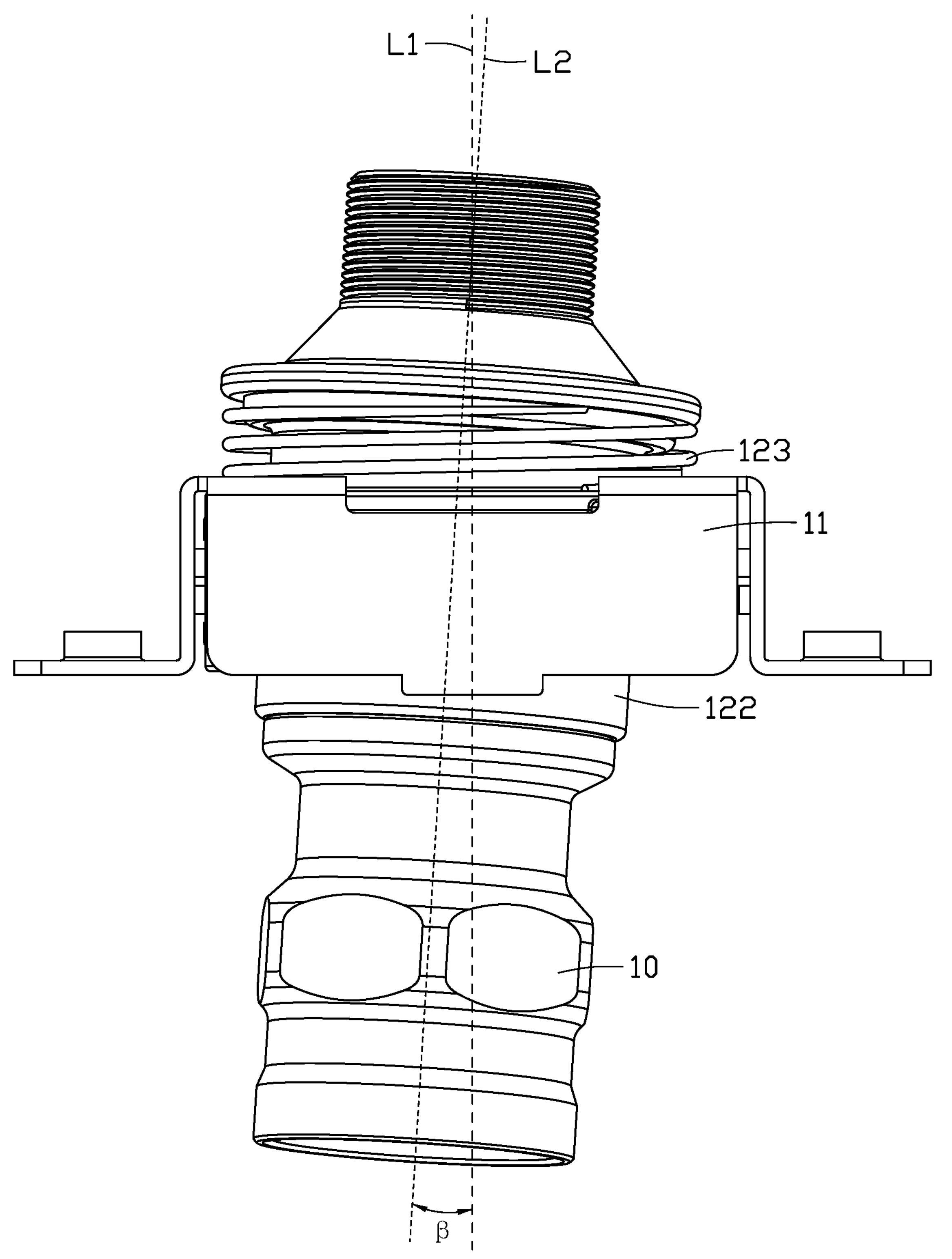
FIG. 10 is a top view of the joint module shown in FIG. 9.

For example, when the plug 410 contacts the plug connector 10 and forces the inner joint 122 only to rotate up left, as shown in FIGS. 9 and 10, the second elastic piece 123 are compressed. When the server 600 is removed from the rack 400, the plug 410 is removed from the plug connector 10, then the second elastic piece 123 will push the inner joint 122 to rotate right and down until the axis L2 of the inner joint 122 is coincided with the axis L1 of the middle joint 121, thus resetting the inner joint 122.

Furthermore, as shown in FIGS. 9 and 10, the angle $\beta$ between the axis L2 of the inner joint 122 and the axis L1 of the middle joint 121 is in a range of 0-6 degrees, such as the angle $\beta$ is equal to 0.5, 1.6, 3.6, 4.9, 5.0, or 6.0 degrees.

In some embodiments, the outer joint 11 has a side wall 112 and a back stopping part 113. The side wall 112 forms the first cavity 111. The back stopping part 113 is used to stop the middle joint 121 from moving along the axis L0 of the outer joint 11.

Furthermore, the first cavity 111 is rectangular shaped, and the combination of the two half rings 1211 are circular shaped. The middle joint 121 further includes at least one rotation stopping part 14 located on the two half rings 1211. The at least one rotation stopping part 14 is placed at a corner of the first cavity 111 and is used to stop the middle joint 121 from rotating around the axis L0 of the outer joint 11.

Furthermore, there are four rotation stopping parts 14 and each rotation stopping part 14 is located at a corner of the first cavity 111. The two half rings 1211 are installed at the rotation stopping part 14 by screws 1213.

In some embodiments, as shown in FIG. 2, the plug connector 10 defines a pipe hole 101 and a funnel surface 102, the funnel surface 102 is used to guide the plug 410 to insert into the pipe hole 101, so the coolant can circulate in the server 600. As shown in FIG. 9, when the inner joint 122 rotates relative to the middle joint 121, the horizontal distance and the vertical distance P2 between a center of the pipe hole 101 and the axis L1 of the middle joint 121 is in a range of 0-5.3 mm.

In some embodiments, if the plug connector 10 only needs to be rotated around the radial directions of the axis L0 of the outer joint 11 when to connect the plug 410, the outer joint 11 and the middle joint 121 can be combined to a second joint body, and the inner joint 122 become a first joint body, the bulge ring 1221 and the annular arc groove 1214 will let the first joint body rotatable relative to the second joint body, and the reset component 20 including the second elastic piece 123 can reset the first joint body, so the axis L of the plug connector 10 and the axis L0 of the first joint body are coincided. Therefore, a joint module including the first joint body with the annular arc groove 1214, the second joint body with the bulge ring 1221, the plug connector 10, and the reset component 20 with the second elastic piece 123 is also disclosed.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A joint module comprising:

an outer joint;

a middle joint connected to the outer joint, the middle joint being movable in radial directions of an axis of the outer joint;

an inner joint connected with the middle joint, the inner joint being rotatable around radial directions of an axis of the middle joint, the axis of the middle joint being parallel to the axis of the outer joint;

a plug connector fixed to the inner joint; and a reset component placed between the outer joint, the middle joint, and the inner joint, the reset component being configured to reset the middle joint and the inner joint, wherein when the middle joint and the inner joint are reset, an axis of the plug connector, the axis of the outer joint, and the axis of the middle joint coincide.

2. The joint module of claim 1, wherein the outer joint defines a first cavity, the middle joint is placed in the first cavity, the reset component comprises a plurality of first elastic pieces, the plurality of first elastic pieces is arranged around the axis of the middle joint and placed between the outer joint and the middle joint, the plurality of first elastic pieces is configured to push the middle joint in the radial directions of the axis of the outer joint to reset the middle joint.

3. The joint module of claim 2, wherein the middle joint defines a second cavity, the inner joint extends through the second cavity, the middle joint further defines an annular arc groove in the second cavity, the annular arc groove is centered around the axis of the middle joint, the inner joint comprises a bulge ring centered around the axis of the inner joint, the bulge ring is placed in the annular arc groove, and the bulge ring is rotatable in the annular arc groove around the radial directions of the axis of the middle joint.

4. The joint module of claim 3, wherein the reset component further comprises a second elastic piece, the second elastic piece is placed between the middle joint and the inner joint, the second elastic piece is configured to push the inner joint along the axis of the middle joint to reset the inner joint.

5. The joint module of claim 3, wherein the middle joint comprises two half rings, the middle joint is formed by a combination of the two half rings, the second cavity is formed in a hollow center of the combination of the two half rings, the annular arc groove is formed in an inner surface of the combination of the two half rings.

6. The joint module of claim 5, wherein each of the plurality of first elastic pieces comprises a frame and two leaf springs, the frame is fixed on an outer surface of the combination of the two half rings, each of the two leaf springs comprises two ends, one of the two ends is connected to the frame, another end of the two ends pushes against the outer joint in the first cavity.

7. The joint module of claim 6, wherein in each of the plurality of first elastic pieces, the two leaf springs are arranged crosswise on the frame.

8. The joint module of claim 7, wherein four first elastic pieces of the plurality of first elastic pieces are placed 90 degrees apart centered around the combination of the two half rings.

9. The joint module of claim 5, wherein the outer joint comprises a side wall and a back stopping part, the side wall forms the first cavity, the back stopping part is configured to stop the middle joint from moving along the axis of the outer joint.

10. The joint module of claim 9, wherein the first cavity is rectangular shaped, the combination of the two half rings is circular shaped, the middle joint further comprises at least one rotation stopping part located on the two half rings, the at least one rotation stopping part is placed at a corner of the first cavity and is configured to stop the middle joint from rotating around the axis of the outer joint.

11. A server system comprising:

a rack comprising a plurality of plugs;

a plurality of servers placed in the rack, each of the plurality of servers comprising:

a chassis; and a joint module located on the chassis, the joint module comprising:

an outer joint;

a middle joint connected to the outer joint, the middle joint being movable in radial directions of an axis of the outer joint;

an inner joint connected with the middle joint, the inner joint being rotatable around radial directions of an axis of the middle joint, the axis of the middle joint being parallel to the axis of the outer joint;

a plug connector fixed to the inner joint, the plug connector being configured to connect one of the plurality of plugs; and a reset component placed between the outer joint, the middle joint, and the inner joint, the reset component being configured to reset the middle joint and the inner joint, wherein when the middle joint and the inner joint are reset, an axis of the plug connector, the axis of the outer joint, and the axis of the middle joint are coincided, the plug connector moves along the axis of the outer joint to connect one of the plurality of plugs.

12. The server system of claim 11, wherein the outer joint defines a first cavity, the middle joint is placed in the first cavity, the reset component comprises a plurality of first elastic pieces, the plurality of first elastic pieces are arranged around the axis of the middle joint, and the plurality of first elastic pieces are placed between the outer joint and the middle joint, the plurality of first elastic pieces is configured to push the middle joint in the radial directions of the axis of the outer joint to reset the middle joint.

13. The server system of claim 12, wherein the middle joint defines a second cavity, the inner joint extends through the second cavity, the middle joint further defines an annular arc groove in the second cavity, the annular arc groove is centered around the axis of the middle joint, the inner joint comprises a bulge ring centered around the axis of the inner joint, the bulge ring is placed in the annular arc groove, and the bulge ring is rotatable in the annular arc groove around the radial directions of the axis of the middle joint.

14. The server system of claim 13, wherein the reset component further comprises a second elastic piece, the second elastic piece is placed between the middle joint and the inner joint, the second elastic piece is configured to push the inner joint along the axis of the middle joint to reset the inner joint.

15. The server system of claim 13, wherein the middle joint comprises two half rings, the middle joint is formed by a combination of the two half rings, the second cavity is formed in a hollow center of the combination of the two half rings, the annular arc groove is formed in an inner surface of the combination of the two half rings.

16. The server system of claim 15, wherein each of the plurality of first elastic pieces comprises a frame and two leaf springs, the frame is fixed on an outer surface of the combination of the two half rings, each of the two leaf springs comprises two ends, one of the two ends is connected to the frame, another end one of the two ends pushes against the outer joint in the first cavity.

17. The server system of claim 16, wherein in each of the plurality of first elastic pieces, the two leaf springs are arranged crosswise on the frame.

18. The server system of claim 17, wherein four first elastic pieces of the plurality of first elastic pieces are placed 90 degrees apart centered around the combination of the two half rings.

19. The server system of claim 15, wherein the outer joint comprises a side wall and a back stopping part, the side wall forms the first cavity, the back stopping part is configured to stop the middle joint from moving along the axis of the outer joint, the first cavity is rectangular shaped, the combined two half rings is circular shaped, the middle joint further comprises at least one rotation stopping part located on the two half rings, the at least one rotation stopping part is placed at a corner of the first cavity and is configured to stop the middle joint from rotating around the axis of the outer joint.

20. A joint module comprising:

a first joint body defining an annular arc groove;

a second joint body comprising a bulge ring, the bulge ring being placed in the annular arc groove, the second joint body being rotatable around radial directions of an axis of the first joint body;

a plug connector fixed to the second joint body, and a reset component placed between the first joint body and the second joint body, the reset component being configured to reset the second joint body, wherein when the second joint body is reset, an axis of the plug connector and the axis of the first joint body are coincided.

* * * * *